United States Patent
Closs et al.

(10) Patent No.: US 6,661,165 B2
(45) Date of Patent: Dec. 9, 2003

(54) INDUCTIVELY COUPLED HIGH-FREQUENCY ELECTRON SOURCE WITH A REDUCED POWER REQUIREMENT AS A RESULT OF AN ELECTROSTATIC INCLUSION OF ELECTRONS

(75) Inventors: Martin Closs, Munich (DE); Johann Müller, Munich (DE)

(73) Assignee: Astrium GmbH, Munich (DE)

( * ) Notice: Subject to any disclaimer, the term of this patent is extended or adjusted under 35 U.S.C. 154(b) by 0 days.

(21) Appl. No.: 09/988,818

(22) Filed: Nov. 20, 2001

(65) Prior Publication Data

US 2002/0101159 A1 Aug. 1, 2002

(30) Foreign Application Priority Data

Nov. 24, 2000 (DE) .......................................... 100 58 326

(51) Int. Cl.[7] .............................. H01J 39/34; H05H 1/46
(52) U.S. Cl. ............................ 313/231.01; 315/111.81; 313/349
(58) Field of Search ......................... 313/231.01, 349, 313/359.1, 363.1, 230, 231.41; 315/111.81; 250/423 R, 423 F

(56) References Cited

U.S. PATENT DOCUMENTS

| | | | | |
|---|---|---|---|---|
| 4,638,216 A | * | 1/1987 | Delaunay et al. ....... 315/111.81 |
| 4,778,561 A | * | 10/1988 | Ghanbari ...................... 216/70 |
| 4,794,298 A | * | 12/1988 | Proudfoot ................. 313/363.1 |
| 4,849,675 A | * | 7/1989 | Muller ................... 315/111.51 |
| 4,894,546 A | * | 1/1990 | Fukui et al. ............. 250/423 R |
| 5,198,718 A | | 3/1993 | Davis et al. |
| 5,434,469 A | * | 7/1995 | Cirri ......................... 313/362.1 |
| 5,666,023 A | * | 9/1997 | Pelletier .................. 313/359.1 |
| 6,369,493 B1 | * | 4/2002 | Lubomirsky et al. .. 313/231.31 |

FOREIGN PATENT DOCUMENTS

| | | |
|---|---|---|
| DE | 3708716 | 5/1991 |
| DE | 19820545 | 11/1998 |
| GB | 1140374 | 1/1969 |
| GB | 2162365 | 1/1986 |

* cited by examiner

Primary Examiner—Sandra O'Shea
Assistant Examiner—Dalei Dong
(74) Attorney, Agent, or Firm—Crowell & Moring LLP

(57) ABSTRACT

An inductively coupled high-frequency electron source is disclosed having a plasma chamber, which is open at least at a first end, the total surface of the open regions of the plasma chamber defined by $A_o$, and having a gas inlet for a gas to be ionized, as well as a high-frequency coil. The interior wall of the plasma chamber is formed at least partially by conductive regions which are connected with a current source, the total surface of the conductive regions defined by $A_c$, and the ratio of the surface amounts $A_o$ to $A_c$ not exceeding a defined maximal value.

18 Claims, 1 Drawing Sheet

INDUCTIVELY COUPLED HIGH-FREQUENCY ELECTRON SOURCE WITH A REDUCED POWER REQUIREMENT AS A RESULT OF AN ELECTROSTATIC INCLUSION OF ELECTRONS

BACKGROUND AND SUMMARY OF THE INVENTION

This application claims the priority of German Patent Document No. 100 58 326.1, filed Nov. 24, 2000, the disclosure of which is expressly incorporated by reference herein.

The present invention relates to an inductively coupled high-frequency electron source having a plasma chamber, which is open at least at a first end, and having a gas inlet for a gas to be ionized, as well as a high-frequency coil.

An inductively coupled high-frequency electron source extracts free electrons from a plasma which is maintained by means of an electric alternating field. This field is generated by an induction coil through which a high-frequency current flows. The electrons present in the plasma are accelerated by the electric alternating field to speeds which, in the event of an impact with a neutral atom in the plasma, can cause the ionization of the latter. During the ionization, one or several additional electrons are freed from the neutral atom, whereby a continuing supply of electrons takes place. After some time, the formed ions impact on the wall of the vessel in which the plasma is held on objects which are immersed in the plasma. If the surface of the wall or of the object at the point of the impact is electrically connected with the current source, the ion can again take up the lost negative charge there, whereby the charge compensation is ensured. As a result, the free electrons in the plasma can partially be withdrawn from it, for example, through an opening in the plasma vessel.

Such an electron source is described, for example, in U.S. Pat. No. 5,198,718 in the form of a neutralizer for an ion source which is formed by a plasma chamber with walls made of a dielectric material which is surrounded by a high-frequency coil.

A large portion of the power required for maintaining the plasma in the vessel of an inductively coupled high-frequency electron source is lost because of the fact that high-energy electrons from the plasma impact on the vessel wall and in the process are again bound to atoms. In this process, they also release a large portion of their energy which they had obtained by means of the electric alternating field.

It is therefore an object of the present invention to provide an electron source which has a reduced power requirement.

According to the invention, the interior wall of the plasma chamber is designed to be conductive and electrically connected with a current source. This may affect either the whole surface of the interior wall or only a portion thereof. In addition, the cross-section of openings in the plasma vessel is appropriately dimensioned for the extraction of the electrons. As a result, an effective electrostatic inclusion of the electrons is achieved in the plasma.

Thus, according to the invention, an inductively coupled high-frequency electron source is provided which has a plasma chamber open at least at a first end, the total surface of the open regions of the plasma chamber amounting to a surface amount $A_0$, as well as having a gas inlet for a gas to be ionized and having a high-frequency coil. This high-frequency coil may be arranged and constructed in different fashions; it must only be suitable for sufficiently exciting the plasma. The high-frequency coil may, for example, be arranged coaxially to the longitudinal dimension of the plasma chamber or, in the form of a spiral, adjoin a wall of the plasma chamber, or may be arranged as a cylinder coil adjacent to the plasma chamber. In this case, the high-frequency coil may be arranged either inside or outside the plasma chamber. The interior wall of the plasma chamber is at least partially formed by conductive regions which are connected with a current source. The conductive regions can be formed in different manners, for example, by a conductive coating of a plasma chamber basic body, by inserting conductive bodies, such as plates or a bush or the like; or the plasma chamber itself may consist—at least partially—of a conductive material. The total surface of the conductive regions amounts to $A_c$ and the ratio of the surface amounts $A_0$ and $A_c$ is maximally $$\frac{A_0}{A_c} = \sqrt{\frac{2\pi m_e}{em_0}} \text{ with}$$

with

| | |
|---|---|
| $m_0$ | mass of an ion of the gas to be ionized and |
| $m_e$ | mass of an electron |
| e | Eulerian number |

In a preferred embodiment, it is provided that the conductive regions are interrupted at least once such that currents are prevented in the conductive regions perpendicular to the direction of the magnetic field of the high-frequency coil which penetrates the plasma chamber. As a result, it can be prevented that the high-frequency field induces currents in the conductive regions which could finally act against the excitation effect of the high-frequency field.

In particular, it may be provided that the conductive regions are interrupted a least once in the circumferential direction of the plasma chamber. Such a measure can be used specifically when the high-frequency field penetrates the plasma chamber essentially perpendicularly to the circumferential direction. This means that, no matter at which point the conductive regions are viewed, at least one interruption is always found in the circumferential direction of the plasma chamber. This interruption may, for example, be formed by an inserted nonconductor or a conductive coating may be constructed such that it does not coat the entire interior wall of the plasma chamber but is interrupted in the circumferential direction. This providing of an interruption in the circumferential direction offers an advantage particularly when the high-frequency coil is arranged outside the conductive regions. In this case, the interruption prevents currents from being induced in the circumferential direction in the conductive regions which would hinder the high-frequency field from penetrating into the plasma chamber. The geometrical shape of the interruption can be selected relatively freely if it meets the abovementioned requirements. In particular, it may also be selected such, for example, by means of an appropriately large width of the interruption, that a capacitive electrical field generated by the high-frequency coil is not shielded by the conductive regions. Such a capacitive electrical field can be utilized, for example, for igniting the plasma in plasma chamber.

It may specifically be provided that the conductive regions of the plasma chamber form a conductive bush which, in the circumferential direction of the plasma chamber, has at least one interruption extending essentially in the direction of the longitudinal dimension of the plasma chamber. The bush may therefore, for example, be slotted essentially in the direction of the longitudinal dimension of the plasma chamber, in which case, the direction of the slot may well deviate, for example, by up to 45° from the direction of the longitudinal dimension.

As a further development of the invention, the conductive regions may have a smaller dimension than the high-frequency coil at least in the region of one of the ends of the plasma chamber in the direction of the longitudinal dimension. Thus, in these regions, the high-frequency coil overlaps the conductive regions and thus extends closer to at least one of the ends of the plasma chamber than the conductive regions. As a result of such a measure, as an alternative or an addition to the above-mentioned measure of a sufficiently wide interruption, it can also be achieved that the capacitive electrical field of the high-frequency coil can sufficiently penetrate into the plasma chamber and its shielding is therefore prevented.

Basically any suitable material which meets the requirements of such an electron source and its special field of application can be selected for the conductive regions. In particular, the conductive regions may consist of one of the metallic materials titanium, steel, especially stainless steel, for example, austenitically, or may consist of aluminum or tantalum. However, as an alternative, the conductive regions may also consist of a semiconductor, particularly of silicon or germanium.

Other objects, advantages and novel features of the present invention will become apparent from the following detailed description of the invention when considered in conjunction with the accompanying drawings.

BRIEF DESCRIPTION OF THE DRAWINGS

In the following, an embodiment of the present invention will be explained by means of FIGS. 1 and 2.

DETAILED DESCRIPTION OF THE DRAWINGS

Figure 1:
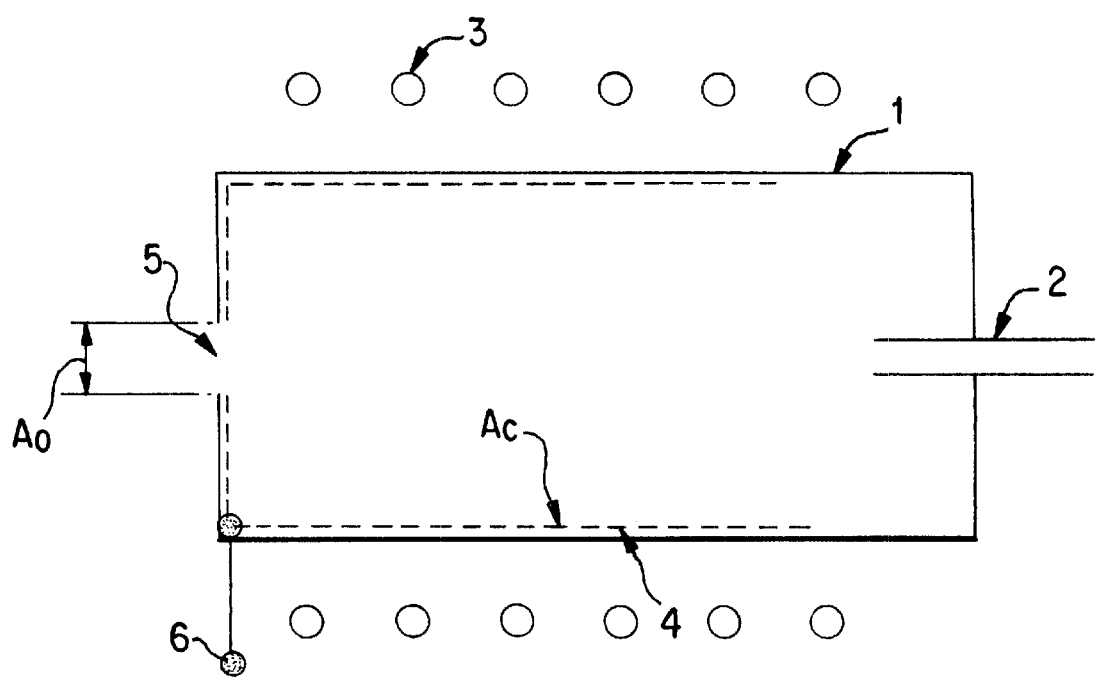
FIG. 1 is a cross-sectional view of a plasma chamber with an exterior high-frequency coil.
Figure 2:
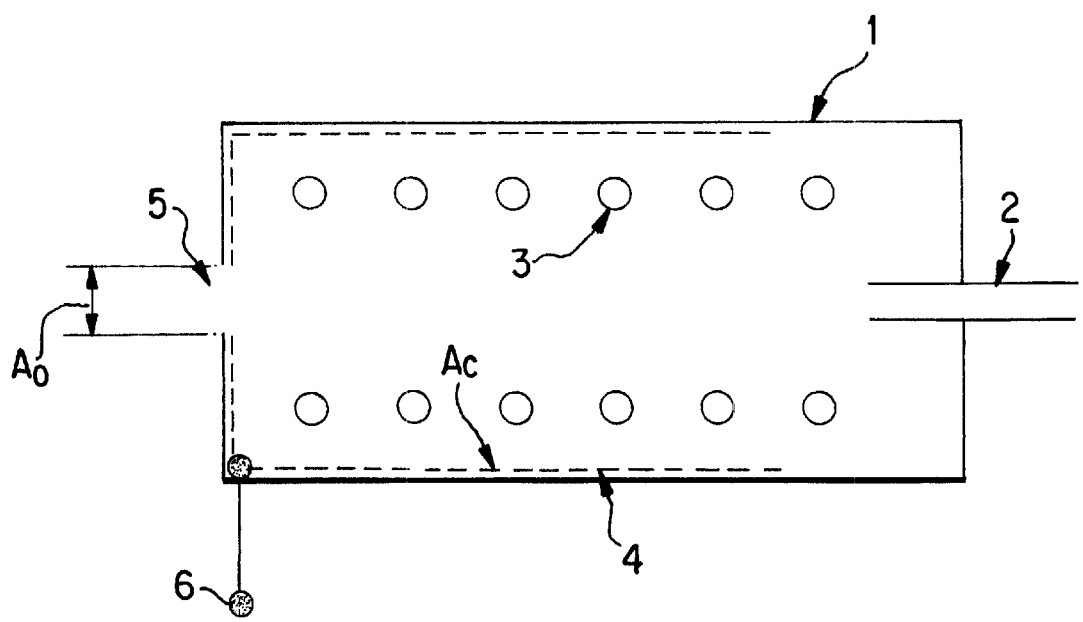
FIG. 2 is a cross-sectional view of a plasma chamber with an interior high-frequency coil.

FIGS. 1 and 2 each illustrate a plasma chamber 1 with an opening 5 (extraction opening for extracting electrons) at a first end of the plasma chamber 1, with a gas inlet 2 at a second end of the plasma chamber 1, and with a high frequency coil 3 which, in this embodiment, is arranged coaxially with respect to the longitudinal dimension of the plasma chamber and, in the case of FIG. 1, is arranged outside the plasma chamber 1 and, in the case of FIG. 2, is arranged inside the plasma chamber 1. However, as initially indicated, other suitable constructions of the high-frequency coil 3 can also be provided. A portion of the interior wall of the plasma chamber is formed by conductive regions 4 which are connected with a current source 6. Such a plasma chamber 1 can be used as an electron source, for example, as a neutralizer of an ion source. An exemplary field of application therefore for the invention is particularly ion engines in aerospace engineering. Naturally, terrestrial applications of the electron source are also conceivable.

The plasma in the plasma chamber 1 is not in a thermal equilibrium because almost the entire high-frequency power of the high-frequency coil 3 is absorbed by the electrons of the plasma and, because of their small mass in comparison to the ions, these electrons can hardly supply power to the ions. This has the result that the electron temperature is by more than a hundred factor above the ion and neutral particle temperature.

Since, in comparison to the ions, the electrons are very light and hot, at the moment of the plasma ignition, clearly more electrons impact on the wall of the plasma chamber 1 than ions, which results in an excess of negative charge on the wall of the plasma chamber 1. The latter is negatively charged and a potential gradient exists between the wall and the plasma. If particle impacts near the wall are neglected, the electrical current balance on the wall can be described as follows:

$$-\frac{1}{4} n_e q_e e^{-\frac{Uq_e}{kT_e}} \langle c_e \rangle + n_e q_e e^{-\frac{1}{2}} c_B = J, \quad (1)$$

wherein $$c_B = \sqrt{\frac{kT_e}{m_0}}$$

[m/s]: Bohm's velocity, $$\langle c_e \rangle = \sqrt{\frac{8kT_e}{\pi m_e}}$$

[m/s]: median thermal velocity of electrons,

J [A/m$^2$]: current density on vessel wall, k [J/K]: Boltzmann's constant, m$_o$ [kg]: mass of an ion, m$_e$ [kg]: mass of an electron, n$_e$ [1/m$^3$]: electron density;

q$_e$ [C]: elementary charge unit,

T$_e$ [K]: electron temperature

U [V]: potential difference between plasma and wall of the plasma chamber.

The first term on the left-hand side of equation (1) represents the electron current density onto the wall, while the second term represents the ion current density. J is the electric current density which is dissipated by the wall. In the case of an insulating wall, J=0. Equation (1) can be solved as follows according to U:

$$U = -\frac{kT_e}{q_e} \ln\left( \sqrt{2\pi m_e} \left( \frac{1}{\sqrt{em_0}} - \frac{J}{n_e q_e \sqrt{kT_e}} \right) \right). \quad (2)$$

The first term of equation (1) illustrates that, when the electron temperature is defined, the electron current density decreases exponentially with the plasma potential U. This can be utilized for the inclusion of electrons in that a high current density J is provided on the wall of the plasma chamber 1 because U increases monotonically with J (compare Equation 2). The current density J is determined by the surface ratio of the extraction opening 5 to the conductive interior wall regions 4 of the plasma chamber 1. For this purpose, the extracted electron current I$_{ex}$, while neglecting the diffusion of ions, is estimated as follows:

$$I_{ex} = \frac{1}{4} \langle c_e \rangle n_e q_e A_0, \quad (3)$$

wherein $A_0$ is the cross-section of the extraction opening 5 (see FIG. 1). If the surface of the conductive interior wall regions 4, which act as a cathode, are called $A_c$ (see FIG. 1), J can be represented as $$J = \frac{I_{ex}}{A_c} \quad (4)$$

When equations (3) and (4) are inserted in equation (2), the following is obtained $$U = -\frac{kT_e}{q_e} \ln\left( \sqrt{2\pi m_e} \left( \frac{1}{\sqrt{em_0}} - \frac{A_0}{\sqrt{2\pi m_e}\, A_c} \right) \right). \quad (5)$$

The plasma potential can therefore be influenced extensively by $A_0/A_c$ in order to ensure an improved electron inclusion. The greater $A_0/A_c$ is selected, the higher U will be, which, in turn, results in a greater inclusion of electrons (see first term in equation (1)). An upper limit of $A_0/A_c$ is set by the relationship $$\frac{1}{\sqrt{em_0}} - \frac{A_0}{\sqrt{2\pi m_e}\, A_c} = 0 \quad (6)$$

In the case of this limit, the argument of the logarithm in equation (5) is zero, which leads to a singularity. Physically, this corresponds to the point at which $I_{ex}$ corresponds to the ion saturation current onto the cathode 4 (2nd term in equation (1)). If $I_{ex}$ continues to rise because of a larger extraction opening 5, a charge compensation will no longer be possible because the ions impacting onto the cathode 4 per time unit will not be sufficient.

Consequently, the present invention can counter the most extensive loss process in the plasma, specifically the loss of high-energy electrons on the wall of the plasma chamber 1. In this case, a potential gradient forms between the plasma and the wall, which gradient shields a majority of the electrons. If, in the present case, the wall of the plasma chamber 1 simultaneously forms the cathode in the form of corresponding conductive regions 4, this potential gradient can be enlarged by a suitable selection of the cross-section of the extraction opening 5 which intensifies the shielding (or the inclusion) of the electrons.

The cross-section of the extraction opening 5 is selected to be as large as possible however, such that the ratio of the opening cross-section to the cathode surface does not exceed the value $$\frac{A_0}{A_c} = \sqrt{\frac{2\pi m_e}{em_0}}$$

The cathode, thus the conductive regions 4, in addition to their primary function, have to meet two additional conditions for ensuring the electrostatic inclusion of the electrons:

1. It must be resistant to the plasma and last longer than the required operating with an acceptable loss of quality.

2. If the high-frequency coil 3 is situated on the outside, the cathode 4 must not shield the high-frequency field from the plasma.

For applications in aerospace engineering, relatively strict requirements exist with respect to such an electron source.

For a use of the electron source as a neutralizer for ion engines in aerospace, currently 8,000 to 15,000 hours of operating time have to be guaranteed. In the case of terrestrial applications, this demand can clearly be reduced because a servicing can take place. Precious gases, such as xenon, can, for example, be used as gases for the plasma.

When selecting the material for the conductive regions 4, thus for the cathode, for a use in aerospace aviation, the following points should be taken into account:

During the operation, ions move onto the cathode with the energy $q_e U$. This may result in erosion.

The temperature of the electron source may maximally reach 300 to 400° C.

Since the source is operated in the high vacuum, the material should have a sufficiently low vapor pressure and should not exhale.

It should be possible to easily arrange the cathode at reasonable cost in a plasma chamber.

The cathode must survive the starting loads during the transport of the device having such an electron source into space.

Several metallic materials which meet these requirements are:

Titanium steel, particularly stainless (austenitic)

aluminum tantalum.

In addition, it would also be conceivable to produce the cathode from a semiconductor, such as silicon or germanium.

The cathode 4 can be implemented, for example, in the form of a conductive bushing which is arranged inside a plasma chamber basic body and forms at least a portion of the interior wall of the plasma chamber 1. If a completely closed, highly conductive bush were installed within the plasma chamber 1 while the high-frequency coil 3 is situated on the outside, currents would be induced in the bush which prevent the electrical high-frequency field from entering. It is therefore necessary to interrupt the cathode 4 in the circumferential direction of the plasma chamber l, for example, along the coil axis, at least once, for example, by slotting, in order to avoid currents in the circumferential direction.

Furthermore, the ignition process should be taken into account: An alternating current of several hundred volts is applied above the coil 3 during the idling operation—thus when current flows in the coil 3 but no plasma is burning. For igniting the plasma, the few free electrons are sufficient which are present in the working gas at the thermal equilibrium. These can be accelerated by the alternating voltage at the coil 3 to sufficient energy in order to ionize the gas. This, in turn, generates secondary electrons which participate in the process. An electron avalanche is created which finally leads to the plasma. This process is called a capacitive ignition because the decisive electrical field is applied between the coil ends and has the character of a capacitor field. The induced high-frequency field, which previously had always been discussed, may not be sufficient for igniting the plasma. For such cases, the ignition of the plasma may take place by means of the described capacitive ignition. The induced high-frequency field can then be used for the plasma heating after the ignition of the plasma has taken place.

For the case of a capacitive ignition, the cathode 4 must not shield the electrical field. For this purpose, either the interruption in the circumferential direction, for example, an axial gap, in the cathode 4 should be wide enough for permitting a partial entering of the electrical field, or the cathode must be designed, at least at one end of the plasma chamber 1, to be slightly shorter than the coil 3, as illustrated in FIGS. 1 and 2.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An inductively coupled high-frequency electron source comprising:

a plasma chamber open at least at a first end wherein a total surface of an open region of the plasma chamber is defined as $A_0$, the plasma chamber having a gas inlet for a gas to be ionized and a high-frequency coil, wherein an interior wall of the plasma chamber is formed at least partially by conductive regions which are connected with a current source, a total surface of the conductive regions defined as $A_c$ and a ratio of the surface amounts $A_0$ and $A_c$ being maximally $$\frac{A_0}{A_c} = \sqrt{\frac{2\pi m_e}{em_0}}$$

wherein $m_0$ = mass of an ion of the gas to be ionized and
$m_e$ = mass of an electron
$e$ = Eulerian number.

2. The electron source according to claim 1, wherein the conductive regions are interrupted at least once such that currents in the conductive regions perpendicular to a direction of a magnetic field of the high-frequency coil which penetrate the plasma chamber are prevented.

3. The electron source according to claim 2, wherein the conductive regions are interrupted at least once in a circumferential direction of the plasma chamber.

4. The electron source according to claim 3, wherein the conductive regions of the plasma chamber form a conductive bush which has at least one interruption in the circumferential direction of the plasma chamber, wherein the interruption extends substantially in a direction of a longitudinal dimension of the plasma chamber.

5. The electron source according to claim 1, wherein the conductive regions at least in a region of one of the ends of the plasma chamber in a direction of a longitudinal dimension of the plasma chamber have a smaller dimension than the high-frequency coil.

6. The electron source according to claim 1, wherein the conductive regions consist of one of the metallic materials of titanium, steel, aluminum, or tantalum.

7. The electron source according to claim 1, wherein the conductive regions consist of a semiconductor, particularly of silicon or germanium.

8. The electron source according to claim 2, wherein the conductive regions at least in a region of one of the ends of the plasma chamber in a direction of a longitudinal dimension of the plasma chamber have a smaller dimension than the high-frequency coil.

9. The electron source according to claim 3, wherein the conductive regions at least in a region of one of the ends of the plasma chamber in a direction of a longitudinal dimension of the plasma chamber have a smaller dimension than the high-frequency coil.

10. The electron source according to claim 4, wherein the conductive regions at least in a region of one of the ends of the plasma chamber in the direction of the longitudinal dimension of the plasma chamber have a smaller dimension than the high-frequency coil.

11. The electron source according to claim 2, wherein the conductive regions consist of one of the metallic materials of titanium, steel, aluminum, or tantalum.

12. The electron source according to claim 3, wherein the conductive regions consist of one of the metallic materials of titanium, steel, aluminum, or tantalum.

13. The electron source according to claim 4, wherein the conductive regions consist of one of the metallic materials of titanium, steel, aluminum, or tantalum.

14. The electron source according to claim 5, wherein the conductive regions consist of one of the metallic materials of titanium, steel, aluminum, or tantalum.

15. The electron source according to claim 2, wherein the conductive regions consist of a semiconductor, particularly of silicon or germanium.

16. The electron source according to claim 3, wherein the conductive regions consist of a semiconductor, particularly of silicon or germanium.

17. The electron source according to claim 4, wherein the conductive regions consist of a semiconductor, particularly of silicon or germanium.

18. The electron source according to claim 5, wherein the conductive regions consist of a semiconductor, particularly of silicon or germanium.

* * * * *